United States Patent

Horikawa

[11] Patent Number: 6,046,095
[45] Date of Patent: Apr. 4, 2000

[54] SEMICONDUCTOR SUBSTRATE HAVING POLYSILICON LAYERS AND FABRICATION PROCESS OF SEMICONDUCTOR DEVICE USING THE SAME

[75] Inventor: Mitsuhiro Horikawa, Tokyo, Japan

[73] Assignee: NEC Corporation, Tokyo, Japan

[21] Appl. No.: 09/340,002

[22] Filed: Jun. 25, 1999

Related U.S. Application Data

[62] Division of application No. 08/800,235, Feb. 12, 1997, Pat. No. 5,973,386.

[30] Foreign Application Priority Data

Feb. 16, 1996 [JP] Japan ................................ 8-029652

[51] Int. Cl.$^7$ .................................................. H01C 21/324
[52] U.S. Cl. ............................................. 438/471; 438/476
[58] Field of Search .............................. 438/58, 143, 310, 438/471, 476; 257/655, 610, 756, 913

[56] References Cited

U.S. PATENT DOCUMENTS

| 4,053,335 | 10/1977 | Hu ............................................. | 438/476 |
| 5,360,748 | 11/1994 | Nadahara et al. ....................... | 438/476 |
| 5,757,063 | 5/1998 | Tomita et al. ........................... | 438/476 |

FOREIGN PATENT DOCUMENTS

| 5182974 | 7/1993 | Japan . |
| 5286795 | 11/1993 | Japan . |

OTHER PUBLICATIONS

"Local Oxidation of Silicon and its Application in Semiconductor Device Technology." Appeals et al.; Phlipsi Res. Dept. 525; 118–132; 1970.

"Afast, Preparation–Free Method to Detect Iron in Silicon"; Zoth et al. J. Appl Phys. 67(11), Jun. 1, 1990; pp. 6764–6771.

"Gettering in Silicon" Kang et al. J. Appl Phys. (65)(8); Apl. 15 1989; pp. 2974–2985.

"Evaluation of Gettering Efficency in Silicon Wafer" Hayamizu et al The Institute of Electronix, Information and Communication Engineers; SDM93–165; pp. 83–89; (Dec. 1993).

Extended Abstracts (The Yist Spring. Meeting, 1994); The Japn. Society of Appl Physics and Related Societies; No. 1; Mar. 28, 1994; pp. 268–269.

*Primary Examiner*—Savitri Mulpuri
*Attorney, Agent, or Firm*—Hayes, Soloway, Hennessey, Grossman & Hage, P.C.

[57] ABSTRACT

On the back side of a base body, three layers of polysilicon layer are formed. These polysilicon layers contain boron. A boron concentration $C_{B(1)}$, $C_{B(2)}$ and $C_{B(3)}$ of the first, second and third polysilicon layers from the base body side have a relationship of $C_{B(1)} \leq C_{B(2)} \leq C_{B(3)}$. On the other hand, between the polysilicon layers, silicon oxide layers are formed respectively. Upon fabrication of a semiconductor device, at first, a gettering heat treatment is effected for the substrate under a given condition. Thus, contaminating impurity is captured at the grain boundary of polysilicon layers formed on the back side of the base body. Next, the polysilicon formed at the most back side is removed by etching. By this, contaminated impurity is removed from the semiconductor substrate.

9 Claims, 3 Drawing Sheets

SEMICONDUCTOR SUBSTRATE HAVING POLYSILICON LAYERS AND FABRICATION PROCESS OF SEMICONDUCTOR DEVICE USING THE SAME

This is a divisional of application Ser. No. 08/800,235 filed on Feb. 12, 1997 U.S. Pat. No. 5,973,386.

BACKGROUND OF THE INVENTION

1. Field of the Invention

The present invention relates generally to a fabrication process of a semiconductor device, such as a large scale integrated circuit (LSI) and so forth, and a semiconductor substrate. More specifically, the invention relates to a semiconductor substrate having polysilicon layers which can prevent an active region of the device from being contaminated by a contaminating impurity, and a fabrication process of a semiconductor device utilizing the same.

2. Description of the Prior Art

Recently, associating with increasing of integrated density and lowering of power consumption of an integrated circuit, in the field of dynamic random access memory (DRAM), for example, a longer data retention time is required than that in the prior art, has been required. The data retention time is determined depending upon p-n junction leakage current. The p-n junction leakage current is caused by contamination of semiconductor substrate by penetration of heavy metal impurity, such as Fe, Ni and Cu or so forth, in a device active region of the semiconductor substrate.

As means for removing these heavy metal impurity (contaminating element) from the active region of the device, various gettering technologies have been proposed. Among the gettering technologies, a method for gettering contaminating element to the grain boundary of the polysilicon layer by forming the polycrystalline silicon layer on the back surface of the wafer is effective. This method is generally referred to as PBS (Polysilicon Back Sealing) method, and has been disclosed in U.S. Pat. No. 4,053,335. When gettering of the contaminating element is performed by using the PBS method, the gettering capacity depends upon grain size of the polysilicon layer. It has been well known that the smaller grain size results in higher gettering capacity.

However, for example, during fabrication process of the DRAM, when a step for thermal process at high temperature is included, grain size of the polysilicon layer becomes large through heat treatment to lower performance in gettering.

Thus, as a solution for the problem set forth above, Japanese Unexamined Patent Publication (Kokai) No. Heisei 5-182974 discloses a semiconductor device, in which a first polysilicon layer, a silicon oxide layer and a second polysilicon layer are stacked on the back surface of the wafer. The prior art disclosed in the above-identified publication will be hereinafter referred to as "first prior art".

FIG. 1 is a section showing the semiconductor device in the first prior art. On the back side of a base body 1, a first polysilicon layer 2 is formed in a thickness of approximately 100 nm. The back side of the first polysilicon layer 2 is slightly oxidized to form a silicon oxide layer 3. Then, on the back side of the silicon oxide layer 3, a second polysilicon layer 4 is formed in a thickness of 400 to 900 nm.

In the first prior art as set forth above, the silicon oxide layer 3 is interposed between the first polysilicon layer 2 and the second polysilicon layer 4. Therefore, even when the device is subject heat treatment, growth of polysilicon grains of the second polysilicon layer 4 located at the most back side of the device can be prevented.

Japanese Unexamined Patent Publication No. Heisei 5-286795 discloses another semiconductor device, in which a silicon oxide layer is formed between the base body 1 and the first polysilicon layer 2. The prior art disclosed in the above-identified publication will be hereinafter referred to as "second prior art".

FIG. 2 is a section of the semiconductor device of the second prior art. On the back surface of the base body 5, a first silicon oxide layer 6 is formed in a thickness of 7 to 20 Å. On the back side of the first silicon oxide layer 6, the first polysilicon layer 7 is formed in a thickness of approximately 2000 Å. On the back side of the first polysilicon layer 7, a second silicon oxide layer 8 is formed in a thickness of 7 to 20 Å and the second polysilicon layer 9 are formed in order.

In such second prior art, since the second silicon oxide layer 8 is formed between the first and second polysilicon layers 7 and 9, similar effect to the first prior art can be obtained. On the other hand, since the first silicon oxide layer 6 is formed between the base body 5 and the first polysilicon layer 7, growth of the grains of the first polysilicon layer 7 can also be restricted.

Accordingly, with these method, even in a LSI fabrication process having step of providing heat treatment for the device at high temperature, the semiconductor device which does not lower gettering performance, can be formed.

On the other hand, in the fabrication process of the LSI, such as DRAM or so forth, a plurality of times of high temperature heat treatment is generally performed for the device. Gettering for avoiding the contaminating impurity is consisted of the following three steps as disclosed in J. S. Kang and D. K. Schroder, "Gettering in Silicon" J. Appl. Phys., Vol. 65, No. 8 (1989), pp. 2974–2985. The three steps are consisted of a first step, in which the contaminating impurity is released from an active region of the device, a second step, in which the contaminating impurity is diffused into a gettering layer (polysilicon layers), and a third step, in which the contaminating impurity is captured in the gettering layer.

However, after once capturing the contaminating impurity in the gettering layer, if the gettering layer is subject to high temperature again by the subsequent heat treatment, the impurity may be released from the gettering layer again to diffuse into the active region of the device. Such re-discharging of the impurity is caused when thermal energy kT applied to the device by the heat process is larger than a coupling energy E between defect in the gettering layer and the contaminating impurity.

Accordingly, a plurality of times of high temperature heat treatment encounters a problem to cause growth of grains of the polysilicon layer formed on the back surface of the base body to lower gettering performance, and to re-discharging of the contaminating impurity in the once captured polysilicon layer. In the fabrication process of DRAM and so forth, in which high temperature heat treatment is repeated for a plurality of time, possibility of re-discharging of contaminating impurity once captured in the polysilicon layer to the base body (silicon wafer) becomes high.

In general, a temperature, at which the contaminating impurity is released from the gettering layer, is lower than a temperature, at which the grains of the polysilicon layer is grown. Accordingly, it is important to find a method for effectively preventing growth of the grains of the polysilicon layer. However, it is more important to prevent re-discharging of the contaminating impurity from the polysilicon layer.

In consideration of such point, in the first and second prior art, since growth of grains of the polysilicon layer during fabrication process is prevented, gettering performance of the contaminating impurity may not be lowered. However, these prior art may not prevent re-discharging of the contaminating impurity. Accordingly, in the prior art, in all of the process steps in the LSI fabrication process, it has been difficult to obtain superior gettering effect.

In the PBS method, the contaminating impurity is gettered at the grain boundary of the polysilicon layer formed on the back surface of the base body. As set forth above, at a high temperature $T_0$, at which the thermal energy kT becomes sufficiently larger than the coupling energy E between the defect presenting at the grain boundary of the polysilicon and the contaminating impurity, the contaminating impurity cannot be captured in the polysilicon layer.

On the other hand, in general, the temperature, at which the contaminating impurity is released from the active region of the device, is lowered than the temperature where the contaminating impurity is released from the gettering layer. Accordingly, at the foregoing temperature $T_0$, the contaminating impurity uniformly present in the gettering layer and non-gettering layer (base body) at a concentration $C_0$. Then, when the temperature is lowered, the contaminating impurity is captured at the defect of the grain boundary of the polysilicon layer. On the other hand, at a certain temperature T, when the contaminating impurity concentration in the gettering layer and the contaminating impurity concentration in the non-gettering layer reaches a balanced condition, the contaminating impurity is distributed in the gettering layer and the non-gettering layer. Such activity of the contaminating impurity has been disclosed in Hayamizu et al. "Evaluation of gettering Efficiency in Silicon wafer" TECHNICAL REPORT OF IEICE, SDM 93–105 (1983), pp. 83–89. The concentration of the contaminating impurity in the non-gettering layer can be derived from the following equation (1).

$$C=C_0/\{1+W_2(K-1)/(W_1+W_2)\} \quad (1)$$

Here, $W_1$ shows the thickness of the non-gettering layer, and $W_2$ shows the thickness of the gettering layer. Also, K is a segregation coefficient of the contaminating impurity between the gettering layer and the non-gettering layer. When the large part of the contaminating impurity is captured in the gettering layer, the concentration of the contaminating impurity in the non-gettering layer becomes lower. Accordingly, smaller value of the contaminating impurity concentration C derived from the equation (1) represents higher gettering performance. Namely, assuming that the thickness of the base body is constant, greater segregation coefficient K and the thickness of the gettering layer $W_2$, the gettering performance becomes higher. In the PBS method, concretely, greater thickness of the polysilicon layer and smaller the grain size of the polysilicon layer represent higher gettering performance.

However, in general, the thickness of the polysilicon layer used in the PBS method, is approximately 1 $\mu$m. When the thickness of the polysilicon layer becomes greater, stress of the base body is loaded to cause deformation of the silicon substrate to affect for the LSI fabrication process. Even when the thickness of the polysilicon layer is increased in the extent not causing deformation in the substrate, it is not possible to enhance gettering performance.

Thus, M. Saito et al., "Gettering of iron using boron doped poly-Si (1), (2)," The Japan Society of Applied Physics and Related Societies (The 41$^{st}$ Spring Meeting, 1994)", AP 941113-01, 29p-ZD-16, 17, P268–269 discloses that, as means for increasing the value of K, there is a method to add boron in the polysilicon layer. Accordingly, in order to enhance the gettering performance, it is effective to make the grain size of the polysilicon layer smaller and to add boron in the polysilicon layer to make the segregation coefficient K greater.

However, even when the segregation coefficient K is made greater, the contaminating impurity once captured is inherently released and diffused at high temperature as set forth above. Thus, under certain cooling condition, the contaminating impurity can be captured in active region of the device. By this, p-n junction leakage current may be caused to lower the characteristics of the semiconductor device.

SUMMARY OF THE INVENTION

It is an object of the present invention to provide a semiconductor substrate having polysilicon layers and a fabrication process of a semiconductor device which can prevent re-discharging of contaminating impurity captured in a gettering layer even when a plurality of times of high temperature heat treatment is performed in a fabrication process of an LSI, such as DRAM or so forth, and can improve characteristics, such as data retention time and so forth, of the semiconductor device.

A semiconductor substrate having polysilicon layers according to one aspect of the invention has a base body, N layers (N is an integer greater than or equal to two) of polysilicon layers formed on the back side of the base body and silicon oxide layers formed between respective of N layers of polysilicon layers. The polysilicon layers contain boron, a boron concentration $C_{B(n)}$ in (n)th (n=1, 2, ... N-1) polysilicon layer from the base body side is lower than a boron concentration $C_{B(n+1)}$ of (n+1)th polysilicon layer from the base body side.

The semiconductor substrate may further includes a silicon oxide layer formed between the base body and a first polysilicon layer. It is preferred that a boron concentration $C_{B(1)}$ of the first polysilicon layer from the base body side is less than or equal to $2\times10^{20}/cm^3$, and a boron concentration $C_{B(N)}$ in the (N)th polysilicon layer is greater than or equal to $1\times10^{21}/cm^3$.

A semiconductor substrate having polysilicon layers, according to another aspect of the invention has a base body, N layers (N is an integer greater than or equal to two) of polysilicon layers formed on the back side of the base body and silicon oxide layers formed between respective of N layers of polysilicon layers. A grain size $R_{(n)}$ of (n)th (n=1, 2, ... N-1) polysilicon layer from the base body side is greater than a grain size $R_{(n+1)}$ of (n+1)th polysilicon layer from the base body side.

A silicon oxide layer may be formed between the base body and a first polysilicon layer. N layers of polysilicon layers are formed by CVD, the grain size of each polysilicon layer is varied by varying formation temperature. For example, the first polysilicon layer from the base body side may be formed at a temperature higher than or equal to 670° C., and (N)th polysilicon layer from the base body side may be formed at a temperature lower than or equal to 610° C.

In the present invention, two or more N layers of polysilicon layer is formed at the back side of the semiconductor substrate. At the most back side of the substrate, the polysilicon layer having the highest gettering effect is present. When the polysilicon layers contains boron, the capturing amount of the contaminating impurity by the polysilicon layer is variable depending upon boron concentration. In the present invention, since the boron concentration $C_{B(n)}$ in (n)th (n=1, 2, ... N−1) polysilicon layer from the base body side is lower than the boron concentration $C_{B(n+1)}$ of (n+1)th polysilicon layer from the base body side. Therefore, when the substrate is subject heat treatment during fabrication process of the semiconductor device, polysilicon layer at the most back side may capture greatest amount of contaminating impurity.

On the other hand, the capturing amount of the contaminating impurity is also variable depending upon the grain size of the polysilicon layer. Therefore, similar effect can attained by providing a grain size $R_{(n)}$ of (n)th (n=1, 2, ... N−1) polysilicon layer from the base body side greater than a grain size $R_{(n+1)}$ of (n+1)th polysilicon layer from the base body side.

Furthermore, in the present invention, the silicon oxide layer is formed between the (n)th polysilicon layer and (n+1)th polysilicon layer to effectively restrict growth of the grains size. Accordingly, even when heat treatment is effected for the substrate for a plurality of times, lowering of the gettering effect can be successfully prevented.

According to a further aspect of the invention, a fabrication process for a semiconductor device utilizing a semiconductor substrate with polysilicon layers has a first step of effecting heat treatment for the semiconductor substrate for capturing contaminating impurity within the polysilicon layers. The semiconductor substrate includes a base body, N layers (N is an integer greater than or equal to two) of polysilicon layers formed on the back side of the base body and silicon oxide layers formed between respective of N layers of polysilicon layers. The polysilicon layers contain boron, a boron concentration $C_{B(n)}$ in (n)th (n=1, 2, ... N−1) polysilicon layer from the base body side is lower than or equal to a boron concentration $C_{B(n+1)}$ of (n+1)th polysilicon layer from the base body side.

A second step is removing a polysilicon layer located at the most back side of the semiconductor substrate.

According to a still further aspect of the invention, a fabrication process for a semiconductor device utilizing a semiconductor substrate with polysilicon layers has a first step of effecting heat treatment for the semiconductor substrate. The semiconductor substrate includes a base body, N layers (N is an integer greater than or equal to two) of polysilicon layers formed on the back side of the base body and silicon oxide layers formed between respective of N layers of polysilicon layers. A grain size $R_{(n)}$ of (n)th (n=1, 2, ... N−1) polysilicon layer from the base body side is greater than or equal to a grain size $R_{(n+1)}$ of (n+1)th polysilicon layer from the base body side.

A second step is removing a polysilicon layer located at the most back side of the semiconductor substrate.

After the second step, a third step for performing heat treatment in normal semiconductor device fabrication process for the semiconductor substrate. The third step may be a heat treatment for performing heat treatment for the substrate at a temperature of higher than or equal to 1100° C. for hours longer than or equal to two.

In the present invention, two or more N layers of polysilicon layers are formed on the back side of the semiconductor substrate. After heat treatment of the substrate during fabrication process of the semiconductor device, the most back side polysilicon layer is removed. Accordingly, even when the fabrication process includes the heat treatment process which otherwise may cause re-discharging of the contaminating impurity once captured in the polysilicon, since the polysilicon capturing the contaminating impurity is removed, re-discharging of the contaminating impurity can be successfully prevented.

When the polysilicon layers formed on the back side of the substrate contains boron, gettering effect for the contaminating impurity is varied by the boron concentration. In the present invention, the boron concentration $C_{B(n)}$ in (n)th (n=1, 2, ... N−1) polysilicon layer from the base body side is lower than or equal to the boron concentration $C_{B(n+1)}$ of (n+1)th polysilicon layer from the base body side.

On the other hand, the gettering effect is also variable depending upon the grain size of the polysilicon layers. In the present invention, the grain size $R_{(n)}$ of (n)th (n=1, 2, ... N−1) polysilicon layer from the base body side is greater than or equal to the grain size $R_{(n+1)}$ of (n+1)th polysilicon layer from the base body.

Even when the $C_{B(n)}$ and $C_{B(n+1)}$ are equal to each other or $R_{(n)}$ and $R_{(n+1)}$ are equal to each other, contaminating impurity removal effect can be attained by removing the most back side polysilicon layer. When the $C_{B(n)}$ is lower than $C_{B(n+1)}$ or $R_{(n)}$ is greater than $R_{(n+1)}$, the amount of the contaminating impurity to be captured in the polysilicon layer becomes greater at the most back side. Accordingly, by varying the boron concentration or the grain size as set forth above, the contaminating impurity removal effect can be further enhanced.

On the other hand, the semiconductor substrate to be used in the method according to the present invention has the silicon oxide layer between the (n)th polysilicon layer and the (n+1)th polysilicon layer. The silicon oxide layer is effective to restrict growth of the grain size of the polysilicon layer by heat treatment. Furthermore, the silicon oxide is effective to prevent the (n)th polysilicon layer from being damaged upon removal of the (n+1)th polysilicon layer. Thus, since the gettering effect of the (n)th polysilicon will never be degraded, the contaminating impurity may be efficiently captured by the (n)th polysilicon layer even in the later semiconductor fabrication process.

On the other hand, according to progress of the fabrication process of the semiconductor device, the surface of the semiconductor substrate is gradually covered. Namely, amount and chance of penetration of the contaminating impurity is gradually reduced according to progress of the fabrication process. In the present invention, the contaminating impurity penetrated into the substrate is captured and removed. Thus, the contaminating impurity can be efficiently removed from the active region of the device.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however to those skilled in the art that the present invention may be practiced without these specific details. In other instance, well-known structures are not shown in detail in order to avoid unnecessary obscure the present invention.

Figure 1:
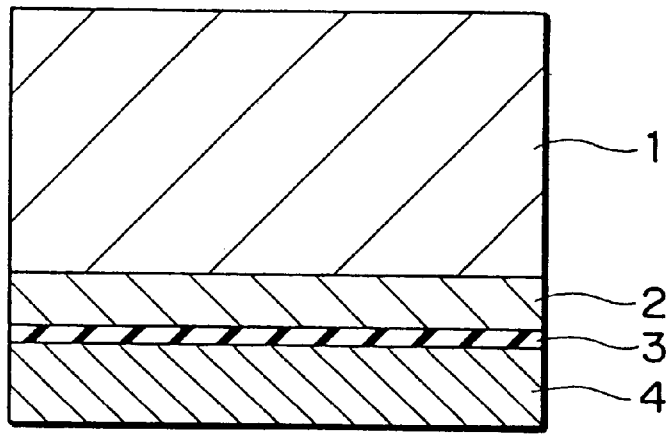
FIG. 1 is a section showing a semiconductor device of the first prior art.
Figure 2:
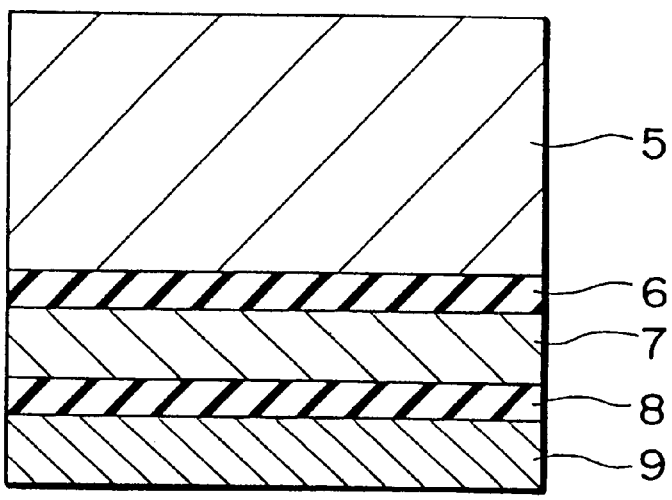
FIG. 2 is a section showing a semiconductor device of the second prior art.
Figure 3:
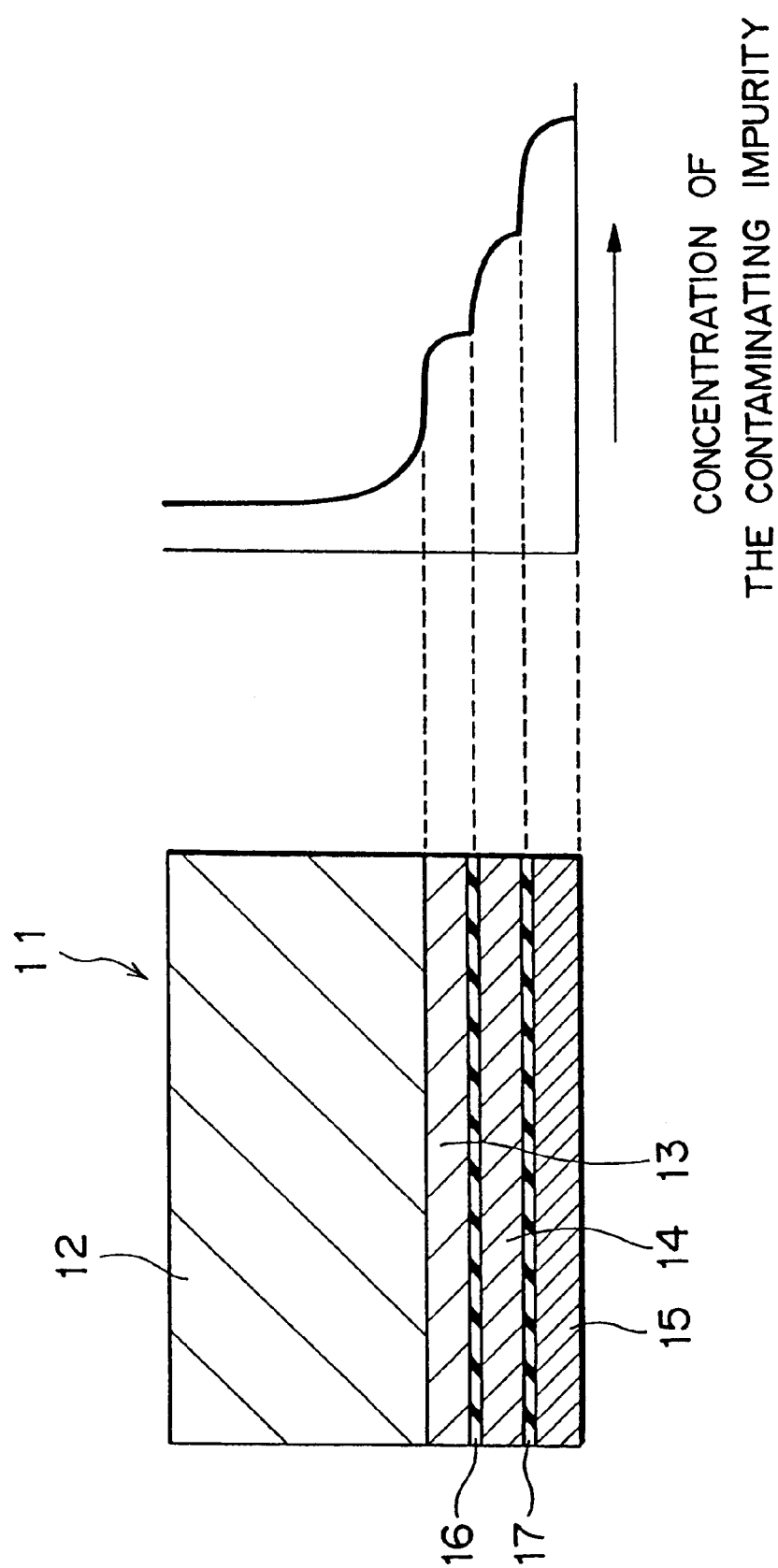
FIG. 3 is an illustration showing a structure of the preferred embodiment of a semiconductor substrate according to the shown embodiment, together with concentration of contaminating impurity in respective layer of the semiconductor substrate.

FIG. 3 is an illustration showing a structure of the preferred embodiment of a semiconductor substrate according to the present invention, and also showing concentration of the contaminating impurity in respective layer of the semiconductor substrate.

As shown in FIG. 3, on the back side of the base body 12, a first polysilicon layer 13 is formed. On the back side of the first polysilicon layer 13, a first silicon oxide layer 16 is formed. On the bask side of the first silicon oxide layer 16, a second polysilicon layer 14 is formed. On the back side of the second polysilicon layer 14, a second silicon oxide layer 17 is formed. Furthermore, on the back side of the second silicon oxide layer 17, a third polysilicon layer 15 is formed.

The first, second and third polysilicon layers 13, 14 and 15 contain boron. The boron concentration $C_{B(1)}$ of the first polysilicon layer 13 is lower than or equal to the boron concentration $C_{B(2)}$ of the second polysilicon layer 14. On the other hand, the boron concentration $C_{B(2)}$ of the second polysilicon layer 14 is lower than or equal to boron concentration $C_{B(3)}$ of the third polysilicon layer 15. Therefore, the boron concentrations of respective polysilicon layers becomes $C_{B(1)} \leq C_{B(2)} < C_{B(3)}$.

When a semiconductor device is fabricated using the semiconductor substrate 11 constructed as set forth above, at first, before high temperature heat treatment as normal LSI fabrication process, gettering heat treatment is performed under a predetermined condition. Then, the three polysilicon layers 13, 14 and 15 formed on the back side serve as gettering layer to capture the contaminating impurity at a grain boundaries thereof. Since gettering performance becomes higher at higher boron concentration, the concentration of contaminating impurity in respective layers is higher from the base body 2 side to the most back side.

Next, the third polysilicon layer 15 formed on the most back side of the semiconductor substrate 11 is removed by etching. In this embodiment, since the second silicon oxide layer 17 is formed between the second and third polysilicon layers 14 and 15, etching of the third polysilicon layer 15 can be stopped at the second silicon oxide layer 17. At this time, the second silicon oxide layer 17 may be removed before advancing the process to the next step, or, in the alternative may not be removed.

Next, high temperature heat treatment as the fabrication process of the LSI is performed for the semiconductor substrate 11. At this time, since the third polysilicon layer 15 which captured large amount of the contaminating impurity, has already removed, re-discharging of large amount of contaminating impurity can be successfully prevented.

Subsequently, when heat treatment has to be effected for the semiconductor substrate 11 at a temperature which can cause re-discharging of the contaminating impurity from the polysilicon layers, the gettering heat treatment is performed for the semiconductor substrate 11 again before the heat treatment process required for fabrication, so that the contaminating impurity may be concentrated in the second polysilicon layer 14.

Thereafter, the second polysilicon layer 14 is removed by etching. At this time, when the second silicon oxide layer 17 is remained, removal of the second polysilicon layer 14 is performed after removal of the second silicon oxide layer 17.

Thus, in the shown embodiment, since the polysilicon layer containing largest amount of the contaminating impurity is removed in advance of the process which possibly cause re-discharging of the contaminating impurity captured in the polysilicon layer, re-discharging of the contaminating impurity once captured in the polysilicon layer to the active region of the device (base body 12). By this, p-n junction leakage current in the LSI device can be restricted, For example, in the field of DRAM, much longer data retention time can be obtained than that in the past.

It should be noted that, in the shown embodiment, separately from the original LSI fabrication process, gettering heat treatment is performed for concentrating the contaminating impurity to the polysilicon layer, it is possible to concentrate the contaminating impurity to the polysilicon layer utilizing other heat treatment in the LSI fabrication process for eliminating special gettering heat treatment.

On the other hand, in the shown embodiment, the polysilicon layers 13, 14 and 15 containing boron are formed on the back side of the base body 12 and the boron concentrations are varied to be $C_{B(1)}$, $C_{B(2)}$ and $C_{B(3)}$. However, instead of varying the boron concentration, it is possible to vary grain sizes of the polysilicon layers. In this case, the grain size $R_{(1)}$ of the first polysilicon layer 13 is equal to or greater than the grain size $R_{(2)}$ of the second polysilicon layer 14, and the grain size $R_{(2)}$ of the second polysilicon layer 14 is equal to or greater than the grain size $R_{(3)}$ of the third polysilicon layer 15. Namely, the grain sizes of respective polysilicon layers has to establish a relationship of $R_{(1)} \geq R_{(2)} \geq R_{(3)}$.

Hereinafter, the examples of fabrication process of semiconductor device according to the present invention will be concretely discussed with comparison with a comparative example.

Test 1

At first, a base body of boron doped p-type silicon and having a diameter of 150 mm was prepared. Then, a semiconductor substrate was fabricated by forming polysilicon layers on the back side of the base body under various conditions shown in the following table 1. As a comparative example, a base body having 1500 nm thick single non-doped polysilicon layer on the back side was used. On the other hand, as examples, the semiconductor substrate having the structure shown in FIG. 3 was used. The layer thickness of the first and second silicon oxide layers between respective polysilicon layers are 3 nm.

On the other hand, temperature shown in the following table 1 represents CVD growth temperature of the polysilicon layer. Lower CVD growth temperature results in smaller grain size of the polysilicon layer. Accordingly, the semiconductor substrate of example No. A has all non-doped first, second and third polysilicon layers which have equal grain sizes of respective layers. Example No. B has polysilicon layers respectively grown at different CVD growth temperatures, in which the first polysilicon layer has the greatest grain size of the third polysilicon layer has the smallest grain size. Example No. C has polysilicon layers having different boron concentration, in which the first polysilicon layer has the lowest boron concentration and the third polysilicon layer has the highest boron concentration.

Next, the surfaces of the obtained semiconductor substrates are intentionally contaminated by iron. Then, for these, thermal diffusion process was performed at 1000° C. for two hours. The thermal diffusion process was effected for uniformly distributing the iron in the thickness direction of the base body. Contamination amount of the iron for the surface of the semiconductor substrate was $10^{13}/cm^2$.

Next, for the semiconductor substrate, gettering heat treatment was effected at 700° C. for four hours. Thereafter, the third polysilicon layer formed on the most back side of the semiconductor substrates of examples Nos. A to C were removed by etching. Also, the second silicon oxide layers between the second and third polysilicon layers were also removed by etching. Then, supposing high temperature heat treatment which causes re-discharging of contaminating impurity from the gettering layer (polysilicon layer), heat treatment was effected for all semiconductor substrates at 1100° C. for two hours.

Subsequently, again, gettering heat treatment was effected for all semiconductor substrate at 800° C. for two hours. Then, the most back side polysilicon layers (second polysilicon layer) and the first silicon oxide layer of the semiconductor substrates of examples Nos. A to C were removed by etching. Thereafter, for all of the semiconductor substrates, heat treatments were effected at 1100° C. for two hours and at 800° C. for two hours.

Thereafter, by SPV (the Surface PhotoVoltage) method disclosed in G. Zoth and W. Bergholz "A fast, preparation-free method to detect iron in silicon", J. Appl. Phys., Vol. 67, No. 11 (1990), P 6764, for example, iron concentration on the surface of respective semiconductor substrate was measured. Greater gettering effect results in smaller iron concentration. The results of measurement is also shown in the following table 1.

TABLE 1

|  | Exam. No. A | Exam. No. B | Exam. No. C | Comp. No. G |
|---|---|---|---|---|
| 1st Polysilicon Layer | 650° C. (non-doped) 500 nm | 670° C. (non-doped) 500 nm | 610° C. (Boron Concentration $2 \times 10^{20}/cm^3$) 500 nm | 650° C. (non-doped) 1500 nm |
| 2nd Polysilicon Layer | 650° C. (non-doped) 500 nm | 640° C. (non-doped) 500 nm | 610° C. (Boron Concentration $5 \times 10^{20}/cm^3$) 500 nm | Not formed |
| 3rd Polysilicon Layer | 650° C. (non-doped) 500 nm | 610° C. (non-doped) 500 nm | 610° C. (Boron Concentration $1 \times 10^{21}/cm^3$) 500 nm | Not formed |
| Residual Iron Concentration on Base body Surface | $5.2 \times 10^{10}/cc$ | $1.2 \times 10^{10}/cc$ | $8.8 \times 10^9/cc$ | $2.6 \times 10^{12}/cc$ |

As shown in the foregoing table 1, the examples Nos. A to C has been effectively reduced greater amount of iron from the active region (base body). This is because that the second and third polysilicon layers are removed before high temperature heat treatment, in which the iron captured in the polysilicon layer may released. By this, the iron captured in the polysilicon layer can be removed together with the second and third polysilicon layers to successfully prevent released of the iron.

Also, in comparison with the example No. A, in which the three polysilicon layers being identical to each other are stacked, the example No. B, in which the grain sizes of respective of the polysilicon layers are varied so that the grain size was reduced from the base body side to the most back side, and the example No. C, in which boron concentration was increased from the base body side to the most back side exhibit greater effect of gettering.

Test 2

In the test 1, results of experiments supposing actual LSI fabrication process. In the test 2, in order to evaluate electrical characteristics of the semiconductor device, n-p junctions are formed in various semiconductor devices and junctions leakage current were measured.

At first, by forming polysilicon layers on the back side of the base body of p-type silicon, semiconductor substrates are formed under various conditions shown in the following table 2. As a comparative example, a base body having 1500 nm thick single non-doped polysilicon layer on the back side was used. As examples, the semiconductor substrates formed the first silicon oxide layer, the first polysilicon layer, the second silicon oxide layer, second polysilicon layer and third silicon oxide layer on the back side of the base body in order, are used. The first, second and third silicon oxide layer between the polysilicon layers were all provided layer thickness of 3 nm.

Similarly to the test 1, the temperature in the following table 2 represent CVD growth temperature of the polysilicon layer. Lower growth temperature results in smaller grain size of the polysilicon layer. Accordingly, an example No. D has non-doped first and second polysilicon layers which have the same grain size of the polysilicon layers to each other. On the other hand, a example No. E is formed with differentiating the CVD growth temperature so that the second polysilicon layer has smaller grain size in comparison with that of the first polysilicon layer. An example No. F is varied boron concentration so that the boron concentration of the second polysilicon layer have higher than that of the first polysilicon layer.

Figure 4:
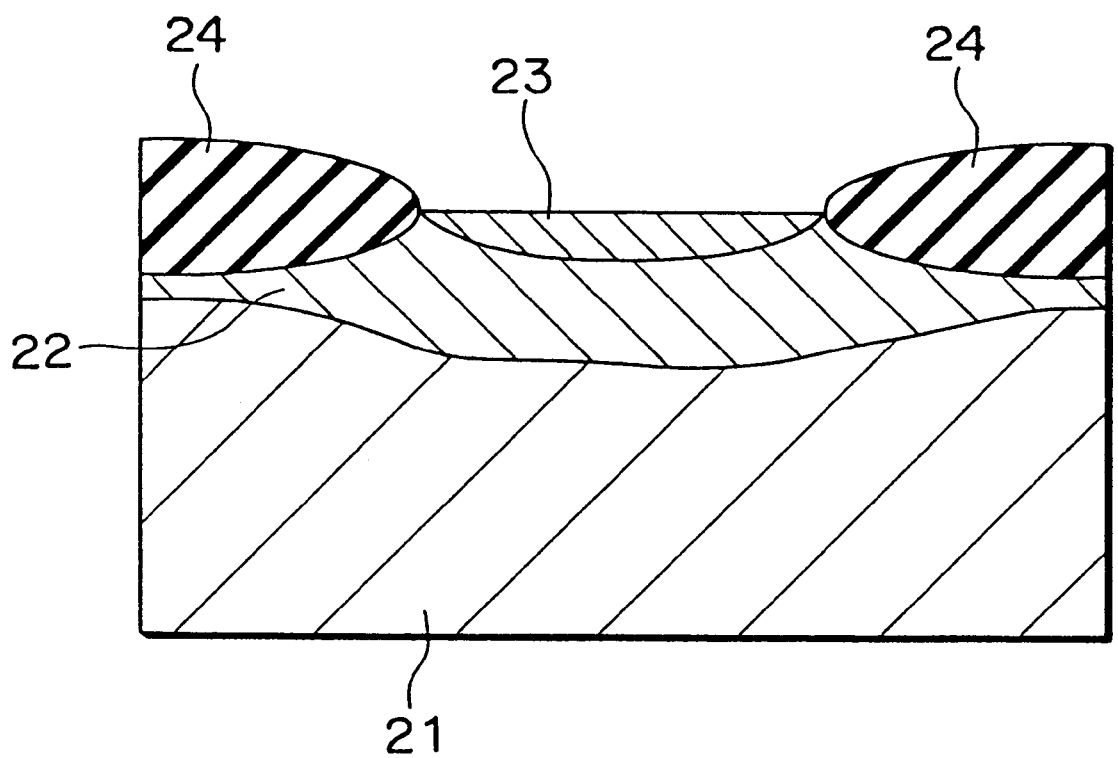
FIG. 4 is a section showing a structure of the semiconductor device fabricated by the preferred embodiment of the fabrication process according to the present invention.

Next, in the obtained semiconductor, n-p junction is formed. FIG. 4 is a section showing the structure of the semiconductor device produced by the shown example. At first, at the surface of the p-type silicon substrate (semiconductor substrate) 21 having various polysilicon layer (not shown) on its back side, a p-type well region 22 is formed. Next, for the examples Nos. D to F, the third silicon oxide layer and the second polysilicon layer are removed, sequentially. For all of the substrate, on the surface of the p-type well region 22, an isolation layer 24 is selectively formed by LOCOS (Local Oxidation of Silicon). Concerning this LOCOS method has been disclosed in J. A. Appels et al. "LOCAL OXIDATION OF SILICON AND ITS APPLICATION IN SEMIDONDUCTOR-DEVICE TECHNOLOGY", Philips Res. Repts., 25, pp. 118 to 132 (1970).

Subsequently, a n-type diffusion layer 23 is formed on the surface of the p-type well region 22 where the isolation layer 24 is not formed, to form the semiconductor device.

Then, n-p junction leakage current was measured. The semiconductor device had been prepared for respective ten samples of the examples and the comparative example. The leakage current was measured at a point 25 on the substrate surface with the same pattern (area and dopant configuration). Average values of the measured leakage current is also shown in the following table 2.

TABLE 2

|  | Exam. No. D | Exam. No. E | Exam. No. F | Comp. No. H |
|---|---|---|---|---|
| 1st Polysilicon layer | 650° C. (non-doped) 750 nm | 650° C. (non-doped) 750 nm | 610° C. (Boron concentration $5 \times 10^{20}/cm^3$) 750 nm | 650° C. (non-doped) 1500 nm |
| 2nd Polysilicon layer | 650° C. (non-doped) 750 nm | 610° C. (non-doped) 750 nm | 610° C. (Boron concentration $2 \times 10^{21}/cm^3$) 750 nm | Not formed |
| junction Leakage Current 5V, at Room Temperature | $7.6 \times 10^{-15}$A | $5.6 \times 10^{-15}$ | $4.2 \times 10^{-15}$A | $8.2 \times 10^{-14}$A |

As shown in the foregoing table 2, the examples D to F have smaller leakage current in comparison with the comparative example No. H. This is because the contaminating impurity is efficiently removed from the active region of the device, which can be a cause of junction leakage current.

In comparison with the example No. D, in which the same two polysilicon layers are stacked, the example No. E, in which the grain size of each polysilicon is differentiated to be reduced from the base body side to the most back side, and the example No. F varying boron concentration to increase from the base body side to the most back side have smaller junction leakage current to exhibit greater gettering effect.

In the foregoing test 2, the formation temperature of the isolation layer 24 by the LOCOS method, is lower than the temperature (1100° C.) of the thermal treatment process in the test 1. Even in such case, the effectiveness of the present invention can be confirmed. Accordingly, in case of the thermal treatment process used in the foregoing example No. 1 is present, further higher effect can be obtained.

Also, the currently used LSIs frequently have twin well structure or triple well structure. Therefore, a plurality of times of high temperature heat treatment is required for forming these structures. For such structure, before heat treatment for forming the well region, it is preferred to remove polysilicon layer at the most back side of the substrata.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims. For instance, while discussion has been given for the examples having two or three polysilicon layers for the semiconductor substrate, it is possible to use the semiconductor substrates of PBS structure with any number n layers of polysilicon layers as the gettering layer.

What is claimed is:

1. A fabrication process for a semiconductor device utilizing a semiconductor substrate with polysilicon layers, comprising:

a first step of effecting heat treatment for said semiconductor substrate including:

a base body;

N layers (N is an integer greater than or equal to two) of polysilicon layers formed on the back side of said base body, containing boron, a boron concentration $C_{B(n)}$ in (n)th (n=1, 2, . . . N−1) polysilicon layer from the base body side being lower than a boron concentration $C_{B(n+1)}$ of (n+1)th polysilicon layer from the base body side; and silicon oxide layers formed between respective of N layers of polysilicon layers, for capturing contaminating impurity within said polysilicon layers; and a second step of removing a polysilicon layer located at the most back side of said semiconductor substrate.

2. A fabrication process as set forth in claim 1, wherein said semiconductor substrate including a silicon oxide layer formed between said base body and a first polysilicon layer.

3. A fabrication process as claimed in claim 1, wherein a boron concentration $C_{B(1)}$ of the first polysilicon layer from the base body side is less than or equal to $2 \times 10^{20}/cm^3$, and a boron concentration $C_{B(N)}$ in the (N)th polysilicon layer is greater than or equal to $1 \times 10^{21}/cm^3$.

4. A fabrication process as set forth in claim 1, which further comprising a third step of performing heat treatment in normal semiconductor fabrication process for said semiconductor substrate.

5. A fabrication process for a semiconductor device utilizing a semiconductor substrate with polysilicon layers, comprising:

a first step of effecting heat treatment for said semiconductor substrate including:

a base body;

N layers (N is an integer greater than or equal to two) of polysilicon layers formed on the back side of said base body, a grain size $R_{(n)}$ of (n)th (n=1, 2, . . . N−1) polysilicon layer from the base body side being greater than a grain size $R_{(n+1)}$ of (n+1)th polysilicon layer from the base body side; and silicon oxide layers formed between respective of N layers of polysilicon layers; and a second step of removing a polysilicon layer located at the most back side of said semiconductor substrate.

6. A semiconductor substrate as set forth in claim 5, wherein said semiconductor substrate including a silicon oxide layer formed between said base body and a first polysilicon layer.

7. A semiconductor substrate as set forth in claim 5, wherein said N layer of polysilicon layers are formed by CVD, the grain size of each polysilicon layer is varied by varying formation temperature.

8. A semiconductor substrate as claimed in claim 7, wherein the first polysilicon layer from said base body side is formed at a temperature higher than or equal to 670° C., and (N)th polysilicon layer from said base body side is formed at a temperature lower than or equal to 610° C.

9. A fabrication process as set forth in claim 5, which further comprising a third step of performing heat treatment in normal semiconductor device fabrication process for said semiconductor substrate.

* * * * *